United States Patent
Allinger et al.

(10) Patent No.: US 9,331,059 B2
(45) Date of Patent: May 3, 2016

(54) CHIP, CHIP PACKAGE AND DIE

(71) Applicant: Infineon Technologies AG, Neubiberg (DE)

(72) Inventors: Robert Allinger, Unterhaching (DE); Gottfried Beer, Nittendorf (DE); Juergen Hoegerl, Regensburg (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 14/101,370

(22) Filed: Dec. 10, 2013

(65) Prior Publication Data

US 2015/0162318 A1    Jun. 11, 2015

(51) Int. Cl.
| | |
|---|---|
| H01L 29/10 | (2006.01) |
| H01L 23/58 | (2006.01) |
| H01L 25/18 | (2006.01) |
| H01L 21/66 | (2006.01) |
| H01L 23/00 | (2006.01) |
| G01R 31/28 | (2006.01) |
| H01L 27/02 | (2006.01) |

(52) U.S. Cl.
CPC ............ *H01L 25/18* (2013.01); *G01R 31/2884* (2013.01); *H01L 22/26* (2013.01); *H01L 22/34* (2013.01); *H01L 24/09* (2013.01); *H01L 27/0248* (2013.01); *H01L 2224/0401* (2013.01); *H01L 2224/05022* (2013.01); *H01L 2224/06131* (2013.01); *H01L 2224/06136* (2013.01); *H01L 2924/14* (2013.01); *H01L 2924/1426* (2013.01); *H01L 2924/1434* (2013.01); *H01L 2924/14252* (2013.01); *H01L 2924/14253* (2013.01)

(58) Field of Classification Search
CPC ......................... G01R 31/2884; G11C 29/1201
USPC ............................................................ 257/48
See application file for complete search history.

(56) References Cited

U.S. PATENT DOCUMENTS

| | | | | |
|---|---|---|---|---|
| 5,899,703 A | * | 5/1999 | Kalter et al. ..................... 438/18 |
| 5,929,650 A | * | 7/1999 | Pappert et al. ............. 324/750.3 |
| 7,400,134 B2 | * | 7/2008 | Morishita et al. ........ 324/762.02 |
| 2004/0027869 A1 | * | 2/2004 | Miwa et al. .................... 365/199 |
| 2004/0113640 A1 | * | 6/2004 | Cooper .................... G01R 3/00 324/750.25 |
| 2005/0283671 A1 | * | 12/2005 | Stave .............................. 714/31 |
| 2008/0001305 A1 | * | 1/2008 | Uchida ......................... 257/777 |
| 2010/0045325 A1 | * | 2/2010 | Doong et al. ................. 324/761 |
| 2011/0156031 A1 | * | 6/2011 | Kim ............................... 257/48 |

* cited by examiner

*Primary Examiner* — Andy Huynh
*Assistant Examiner* — Sitaramarao S Yechuri (57) ABSTRACT

In various embodiments, a chip for a chip package is provided. The chip may include a substrate and an integrated circuit over the substrate. The integrated circuit may include a test circuit, for example a built-in self-test circuit, and an operation circuit, the test circuit including one or more first driver stages each having a first driver performance and the operation circuit including one or more second driver stages each having a second driver performance which is different from the first driver performance, first contacts electrically coupled with the first driver stages, and second contacts electrically coupled with the second driver stages, wherein the test circuit and the first contacts are configured to provide a test mode for testing the integrated circuit and wherein the operation circuit and the second contacts are configured to provide an operating mode of the integrated circuit being different from the test mode.

23 Claims, 4 Drawing Sheets

CHIP, CHIP PACKAGE AND DIE

TECHNICAL FIELD

Various embodiments relate generally to a chip, a chip package and a die.

BACKGROUND

Conventional chips may include micro controllers, for example micro processors, and/or memory elements, for example flash memories. One conventional concept for integrating micro controllers and memories in one single device is the so-called System On Chip (SOC) in which the whole system including the micro controller and the memory is integrated on one single chip. For example in the field of wireless industrial applications this concept has widely been used. Another conventional concept for integrating micro controllers and memories in one single device is the System In Package (SIP) in which the micro controller is formed by a first chip and the memory is formed by a second chip, wherein both chips are integrated in one package. Both chips are usually arranged on one substrate, in one casing, or on top of each other.

SUMMARY

In various embodiments, a chip for a chip package is provided. The chip may include a substrate and an integrated circuit over the substrate. The integrated circuit may include a test circuit, for example a built-in self-test circuit, and an operation circuit, the test circuit including one or more first driver stages each having a first driver performance and the operation circuit including one or more second driver stages each having a second driver performance which is different from the first driver performance, first contacts electrically coupled with the first driver stages, and second contacts electrically coupled with the second driver stages, wherein the test circuit and the first contacts are configured to provide a test mode for testing the integrated circuit and wherein the operation circuit and the second contacts are configured to provide an operating mode of the integrated circuit being different from the test mode.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

If two chips are arranged on top of each other in one chip package, there is the possibility to arrange the chips face to face so that the front sides of the chips face each other. One of the chips may be called mother-chip and the other chip may be called daughter-chip. The chips may be connected with each other by contact pins, for example by contact pins including copper, silver and/or gold or another electrically conductive material. The daughter-chip may be electrically coupled to the mother-chip via the contact pins. The mother-chip may include bond pads for electrically coupling the mother-chip to a further device, for example a package substrate, a casing, and/or one or more external devices. For example, the mother-chip may be electrically coupled to the package substrate via a flip chip connection. The bond pads may have sufficient size and pitch such that they may be contacted with the help of common needles of a probe-card for testing the mother-chip before arranging the daughter-chip on the mother-chip and/or the mother-chip and the daughter-chip as an overall system after arranging the daughter-chip on the mother-chip. The test may be carried out before separating the mother-chips from a wafer providing the substrate for the mother-chips.

Chips, e.g. daughter-chips for a chip package, may be designed to minimize the total lengths of the interconnects between the chips, to provide parallel interfaces between the mother-chip and the daughter-chip in order to provide a high speed data transfer between the chips and in order to lower electric losses during data transfer and to provide redundant interconnects in order to increase a mechanical reliability. These chips may for example include a plurality of contact pins being distributed over a front side of the chips and having a pitch which is smaller than e.g. 100 μm. Additionally, such chips may only include I/O driver stages being electrically connected with the contact pins and having a low output current in order decrease the size of the corresponding chip. However, when providing a daughter-chip having contact pins with a pitch smaller than for example 100 μm, this daughter-chip may not be tested independent from the mother-chip by means of a conventional probe card technology because of the small pitch and because of the absence of driver stages providing sufficient output current to carry out the test.

Therefore, if the daughter-chip should be tested independent from the mother-chip, the pitch of a corresponding conventional chip is not smaller than 100 µm, such that each contact pin may be contacted by a needle of a common probe card and every signal carrying contact pin is connected to a corresponding driver stage having an output current sufficiently high for carrying out the test. Further, conventional chips may include only a limited amount of contact pins in order to simplify the testing ability.

In various embodiments, a chip (which may also be referred to as a die) is provided which has contacts which may have a pitch smaller than 100 µm, for example smaller than 80 µm, which may have a small size and/or which may be tested independent of a second chip on which the chip, in this context a first chip, may be arranged in a chip package. In various embodiments, corresponding methods for manufacturing such chips and/or such a chip package in a simple and/or cost saving manner are provided. Further, methods for testing such a chip are provided which enable to test the corresponding chip independent of the second chip on which the chip may be arranged in a chip package.

In various embodiments, a chip for a chip package may be provided. The chip may include a substrate and an integrated circuit over the substrate. The integrated circuit may include a test circuit and an operation circuit. The test circuit may include a plurality of first driver stages, wherein each first driver stage may have a first driver performance. The operation circuit may include a plurality of second driver stages, wherein each second driver stage may have a second driver performance being different from the first driver performance. First contacts of the chip may be electrically coupled to corresponding first driver stages. The first contacts and the test circuit may be configured to provide a test mode for testing the integrated circuit. Second contacts of the chip may be electrically coupled to corresponding second driver stages. The second contacts and the operation circuit may be configured to provide an operation mode being different from the test mode.

The driver stages may include drivers and/or may for example include one, two or more transistors and/or other active or passive electronic components like for example resistors, logical gates, inverters, and/or I/O-drivers. The chip may be referred to as a first chip or a daughter-chip and may include a microprocessor. The first contacts may for example be arranged only for carrying out the test mode and for testing the integrated circuit. In the operation mode of the chip, all possible operations of the chip except the test mode may be carried out. The possible operations may include the execution of digital calculations and/or commands. The first contacts may for example be configured as contact pins, contact pillars, or contact pads.

In various embodiments, the first contacts and/or the second contacts may be distributed over a polygonal surface of the chip, wherein the first contacts may be arranged in at least one corner of the polygonal surface.

In various embodiments, the first performance may be at least five times larger than the second performance, for example if the first performance represents a driver strength, an ESD protection, an output current, and/or a fanout. The fanout of a logic gate output may be the number of gate inputs it can feed or connect to.

In various embodiments, the ESD protection of the first contacts may be at least five times larger than the ESD protection of the second contacts.

In various embodiments, the first performance may be at least five times less than the second performance, for example if the first performance represents a driver current/speed.

In various embodiments, a distance from one of the contacts to the adjacent contact may be in a range from about 1 µm to about 100 µm, for example in the range from about 5 µm to about 80 µm, for example in the range from about 20 µm to about 75 µm. All contacts may have the same distance to their neighboring contacts or may have different distances. For example, the distances vary by a factor of 2 or less, for example by a factor of 1.5 or less, for example by a factor between 1.2 and 1. In other words, one of the distances may be the same like the other distances, may be another of the distances times 1.2 or less, may be another of the distances times 1.5 or less or may be another of the distances times 2 or less.

In various embodiments, the first contacts may have a first distance to each other and the second contacts may have a second distance to each other, wherein the first distance may be different from the second distance.

In various embodiments, the first contacts may be arranged in groups, wherein all first contacts of one group may be electrically coupled with each other and/or may be electrically coupled with the same first driving stage.

In various embodiments, four first contacts may be arranged in one group and the four first contacts may be arranged in corners of a square.

In various embodiments, four groups of first contacts may be arranged in one corner of a surface of the chip.

In various embodiments, the performance of the driver stages may be characterized by at least one of a driver strength, a driver speed, an ESD protection, an output current, and a fanout of the corresponding driver stages.

In various embodiments, the first driver performance may be characterized by at least one of a high driver strength, a low driver speed, a high ESD protection, a high output current, and a high fanout of the first driver stages.

In various embodiments, the second driver performance may be characterized by at least one of a low driver strength, a high driver speed, a low ESD protection, no ESD protection, a low output current, and a low fanout of the second driver stages. For example, the low driver strength, the low ESD protection, the low output current, and/or the low fanout of the second driver stages may be lower than the high driver strength, the high ESD protection, the high output current, and/or the high fanout, respectively, of the first driver stages. For example, the high driver speed of the second driver stages may be higher than the low driver speed of the first driver stages.

In various embodiments, a method of manufacturing a chip for a chip package may be provided. The method may include providing a substrate with an integrated circuit over the substrate. The integrated circuit may include a test circuit and an operation circuit. The test circuit may include first driver stages each providing a first driver performance. The operation circuit may include second driver stages each having a second driver performance which may be different from the first driver performance. First contacts of the chip may be formed such that they are electrically coupled to the first driver stages. The first contacts and the test circuit may be configured to provide a test mode for testing the integrated circuit. Second contacts of the chip may be formed such that they are electrically coupled to the second driver stages. The second contacts and the operation circuit may be configured to provide an operation mode being different from the test mode.

In various embodiments, a chip package may be provided. The chip package may include a chip, e.g. a first chip, including a substrate and an integrated circuit over the substrate. The integrated circuit may include a test circuit and an operation circuit. The test circuit may include a plurality of first driver stages, wherein each first driver stage may provide a first driver performance. The operation circuit may include a plurality of second driver stages, wherein each second driver stage may provide a second driver performance which may be different from the first driver performance. First contacts of the chip may be electrically coupled to the first driver stages. The first contacts and the test circuit may be configured to provide a test mode for testing the integrated circuit. Second contacts of the first chip may be electrically coupled to the second driver stages. The second contacts and the operation circuit may be configured to provide an operation mode of the integrated circuit being different form the test mode. The chip package may further include a second chip. The second chip may include third contacts and fourth contacts. The third contacts may be configured to provide electrical and mechanical contacts for corresponding second contacts of the first chip and the fourth contacts may be configured to provide electrical contacts of the chip package, for example for an external device. The second chip may be configured to carry the first chip, wherein the third contacts may be electrically and mechanically coupled with corresponding second contacts of the first chip.

In various embodiments, the first contacts of the first chip may be not electrically coupled with the second chip. Alternatively or additionally the first contacts of the first chip may be electrically coupled to a given potential.

In various embodiments, the first chip may be a microprocessor and the second chip may be at least one of a memory, an AD-converter, a DA-converter, a delta-sigma converter, an input/output stage, a DC/DC converter.

In various embodiments, the first chip may include a front side and a back side of the first chip, wherein the first contacts of the first chip may be arranged on the front side of the first chip. The second chip may include a front side and a backside of the second chip. The third contacts of the second chip may be arranged on the front side of the second chip. The front side of the first chip may face the front side of the second chip.

In various embodiments, a method of manufacturing a chip package may be provided. The method may include: providing a first chip including a substrate and an integrated circuit over the substrate, wherein the integrated circuit may include a test circuit and an operation circuit, wherein the test circuit may include a plurality of first driver stages, wherein each first driver stage may provide a first driver performance and wherein the operation circuit may include a plurality of second driver stages, wherein each second driver stage may include a second driver performance which may be different from the first driver performance; forming first contacts of the first chip such that they are electrically coupled to the first driver stages, wherein the first contacts and the test circuit may be configured to provide a test mode for testing the integrated circuit; forming second contacts of the first chip such that they are electrically coupled to corresponding second driver stages, wherein the operation circuit and the second contacts may be configured to provide an operation mode of the integrated circuit being different from the test mode; providing a second chip including third contacts and fourth contacts; arranging the first chip on the second chip such that the third contacts may be electrically and mechanically coupled with corresponding second contacts of the first chip, with the fourth contacts being configured to provide electrical contacts of the chip package.

In various embodiments, a method for testing an integrated circuit of a chip may be provided. The method may include: electrically contacting at least two groups of first contacts of the first chip with the first contacts being coupled to a plurality of first driver stages of a test circuit of the integrated circuit, wherein the first contacts and the test circuit may be configured to provide a test mode for testing the integrated circuit, wherein each group may include at least two first contacts and wherein the first contacts of one group may be electrically coupled to each other; and driving the integrated circuit in the test mode by the test circuit via the contacted groups of first contacts.

In various embodiments, a die for a chip package may be provided. The die may include a substrate and an integrated circuit over the substrate. The integrated circuit may include a built in self-test circuit and an operation circuit. The test circuit may include first drivers each having a first output current. The operation circuit may include second drivers each having a second output current which may be less than the first output current. Contact pins, for example first contact pins, of the die may electrically be coupled to the first drivers and may be arranged for electrically contacting the test circuit. The contact pins and the built in self-test circuit may be configured to carry out a self-test of the integrated circuit. Second contacts, for example second contact pins, of the die may be electrically coupled to the second drivers. The second contacts and the operation circuit may be configured to carry out at least one operation of the integrated circuit being different from the self-test. The operation different from the self-test may be a normal operation of the die, for example a calculation.

In various embodiments, the contact pins and the second contacts may be distributed over a polygonal surface of the die. The contact pins may be arranged in the corners of the polygonal surface.

In various embodiments, the first output current may be at least five times larger than the second output current.

In various embodiments, a pitch between the contact pins and/or the second contacts may be in the range from about 1 µm to about 100 µm, for example in the range from about 5 µm to about 80 µm, for example in the range from about 20 µm to about 75 µm.

In various embodiments, the contact pins may have a first pitch to one each other and the second contacts may have a second pitch to one each other, wherein the first pitch may be different from the second pitch. The pitch may be a typical distance between neighbored pins. The pitches, for example the first pitches and/or the second pitches may be regular or not and/or may differ from each other or not.

In various embodiments, the contact pins may be grouped together, wherein all contact pins of one of these groups may be directly coupled with each other and/or may be electrically coupled with the same first driver.

In various embodiments, four contact pins may be arranged in one group and these four contact pins may be arranged in corners of a square with each corner including one first contact pin.

In various embodiments, four groups of contact pins may be arranged in one corner of a surface of the die.

In various embodiments, a method for manufacturing a die for a chip package may be provided. The method may include: providing a substrate with an integrated circuit over the substrate, with the integrated circuit including a built in self-test circuit and an operation circuit, with the built in self-test circuit including first drivers each having a first output current and with the operation circuit including second drivers each having a second output current which may be less than the first output current; forming first contacts of the die such that they are electrically coupled to the first drivers, wherein the first contacts and the test circuit may be configured to carry out a self-test of the integrated circuit; forming second contacts of the die such that they are electrically coupled to the second drivers, wherein the second contacts and the operation circuit may be configured to carry out at least one operation of the integrated circuit being different from the self-test.

In various embodiments a chip package may be provided. The chip package may include: a die, for example a first die, which may include a substrate and an integrated circuit over the substrate. The integrated circuit may include a built in self-test circuit and an operation circuit. The built in self-test circuit may include a first driver having a first output current. The operation circuit may include a second driver having a second output current which may be less than the first output current. Contact pins, for example first contact pins, of the die may be electrically coupled to the first drivers. The contact pins and the built in self-test circuit may be configured to carry out a self-test of the integrated circuit. Second contacts, for example second contact pins of contact pads, of the die may be electrically coupled to the second drivers. The second contact pins and the operation circuit may be configured to carry out at least one operation of the integrated circuit being different from the self-test. A mother-chip of the chip package which may include third contacts and fourth contacts. The third contacts may be configured to electrically and mechanically couple corresponding second contacts of the first die. The fourth contacts may be configured to provide electrical contacts of the chip package. The mother-chip may carry the die. The third contacts may be electrically and mechanically coupled with corresponding second contacts of the die. The die may be referred to as daughter-chip.

In various embodiments, the contact pins of the die are, for example, not electrically coupled with the mother-chip. Alternatively or additionally, the contact pins of the die may be electrically coupled to a given potential.

In various embodiments, the die may be a microprocessor and the mother-chip may be a memory.

In various embodiments, the die may include a front side and a back side of the die. The first contacts of the die may be arranged on the front side of the first die. The mother-chip may include a front side and a backside of the mother-chip. The third contacts of the mother-chip may be arranged on the front side of the mother-chip. The front side of the die may face the front side of the mother-chip.

In various embodiments, a method for manufacturing a chip package may be provided. The method may include: providing a die including a substrate and an integrated circuit on the substrate, with the integrated circuit including a built in self-test circuit and an operation circuit. The built in self-test circuit may include a first driver having a first output current and with the operation circuit comprising second driver having a second output current which may be less than the first output current; forming contact pins of the die such that they are electrically coupled to the first drivers, wherein the contact pins and the test circuit may be configured to carry out a self-test of the integrated circuit; forming second contacts of the die such that they are electrically coupled to the second drivers, wherein the second contacts and the operation circuit may be configured to carry out at least one operation of the integrated circuit being different from the self-test; providing a mother-chip including third contacts and fourth contacts, wherein the third contacts may be configured to provide electrical and mechanical contacts for corresponding second contacts of the die and wherein the fourth contacts may be configured to provide electrical contacts of the chip package; and arranging the die on the mother-chip, wherein the third contacts may be electrically and mechanically coupled with corresponding second contacts of the die.

In various embodiments, a method for testing an integrated circuit of a die for a chip package may be provided. The method may include: electrically contacting at least two groups of contact pins of the die with the contact pins being coupled to first drivers of a test circuit of the integrated circuit, with the first contacts and the test circuit being configured to carry out a self-test of the integrated circuit, wherein each group may include at least two contact pins and wherein the contact pins of one group may be electrically coupled to each other; and carrying out the self-test of the integrated circuit by the test circuit via the contacted groups of contact pins.

Figure 1:
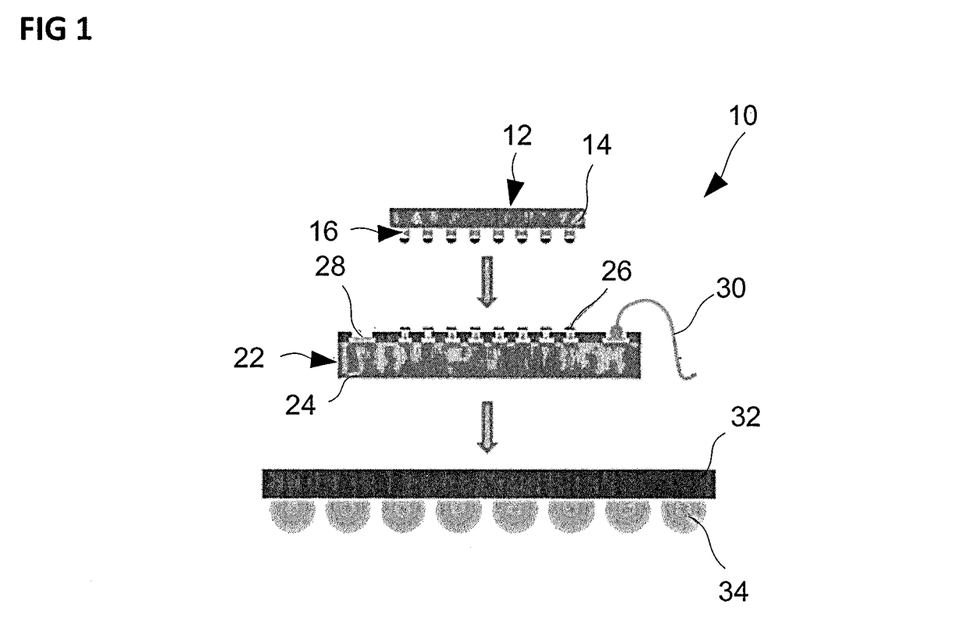
FIG. 1 shows an exploded view of an embodiment of a chip package.

FIG. 1 shows an embodiment of a chip package 10. The chip package 10 may include a chip, for example a first chip 12. The first chip 12 may also be referred to as a die. The first chip 12 may include a substrate 14. The substrate 14 may include an integrated circuit (not shown). The integrated circuit may form an ASIC, e.g. a microcontroller and/or a microprocessor. The integrated circuit may include a test circuit (not shown) for testing the integrated circuit. The test circuit may be a built-in self-test circuit (BIST). The test circuit may be configured to provide a test mode of the integrated circuit. The test circuit may be configured such that when triggering the self-test of the test circuit by inputting some test signals to the test circuit a test mode of the test circuit is activated and the proper functionality of the integrated circuit may be checked by monitoring and/or analyzing corresponding test output signals of the test circuit. The integrated circuit may further include an operation circuit (not shown). The operation circuit may be configured to provide an operation mode. In the operation mode the operation circuit may carry out at least one operation different from the self-test, for example the execution of a calculation and/or command independent from any test functionality. In various embodiments, after carrying out the self-test in the test mode, the first chip 12 may only be operated in the operation mode.

The first chip 12 may include several contacts 16 which may be arranged on the first side of the first chip 12. The first side of the first chip 12 may also be referred to as the front side of the first chip 12. A second side or back side of the first chip 12 is facing away from the first side of the first chip 12. The contacts 16 may include contact pins and/or contact pillars and/or contact pads. The contacts 16 may include an electrically conducting material or are made out of it. The contacts 16 may include copper, tin, silver, and/or gold.

The chip package 10 may further include a second chip 22. The second chip may be referred to as mother-chip and/or second die. The second chip 22 may include a second substrate 24. The second substrate 24 may include a second integrated circuit which may form a ASIC element, for example a flash memory, AD-converter, DA-converter, delta-sigma converter, input/output stages, DC/DC converters. The second chip 22 may further include several third contacts 26 which are provided for electrically contacting at least a few of the contacts 16 of the first chip 12. The third contacts 26 may be arranged at a first side of the second chip 22. The first side of the second chip 22 may also be referred to as the front side of the second chip 22. The second chip 22 may include a second side or back side of the second chip 22 facing away from the first side of the second chip 22. The third contacts 26 may include terminals and/or sockets for the first contacts 16 of the first chip 12. The second chip 22 may further include fourth contacts 28 for electrically contacting the second chip 22 and/or for electrically contacting the first chip 12 via the second chip 22. The fourth contacts 28 may for example be electrically coupled to one, two, or correspondingly more electrical connectors, for example as depict in FIG. 1, to a plurality of wire bonds 30. In another embodiment the fourth contacts 28 may be flip chip bonded (for example overlapping the thin first chip 12 by use of Cu-pillars) to the carrier 32. In a further embodiment the fourth contacts 28 may be arranged on the backside 24 of the chip 22, and may be coupled by TSVs (Through Silicon Vias) to at least one of the third contacts 26, and may be flipchip bonded to the carrier 32.

The chip package 10 may further include a carrier 32 for carrying the second chip 22 and/or for arranging the second chip 22. The carrier 32 may be a substantially flat carrier or may be a part of a casing of the chip package 10. The carrier 32 may include electrical contacts 34 which may be arranged on a side of the carrier 32 facing away from the second chip 22.

The second chip 22 may be arranged on the carrier 32. The first chip 12 may be arranged on the second chip 22, wherein then the second chip 22 may be arranged between the first chip 12 and the carrier 32. For example, the second chip 22 may be fixed to the carrier 32 by a mechanical and/or chemical and/or electrical connection. For example the second chip 22 is adhered to the carrier 32. The first chip 12 may for example be arranged at the second chip 22 in such a way that at least some of the contacts 16 are mechanically and/or electrically coupled to the third contacts 26 of the second chip. In this context the second chip 22 may be referred to as a mother-chip and the first chip 12 which is arranged on the mother-chip may be referred to as a daughter-chip.

Figure 2:
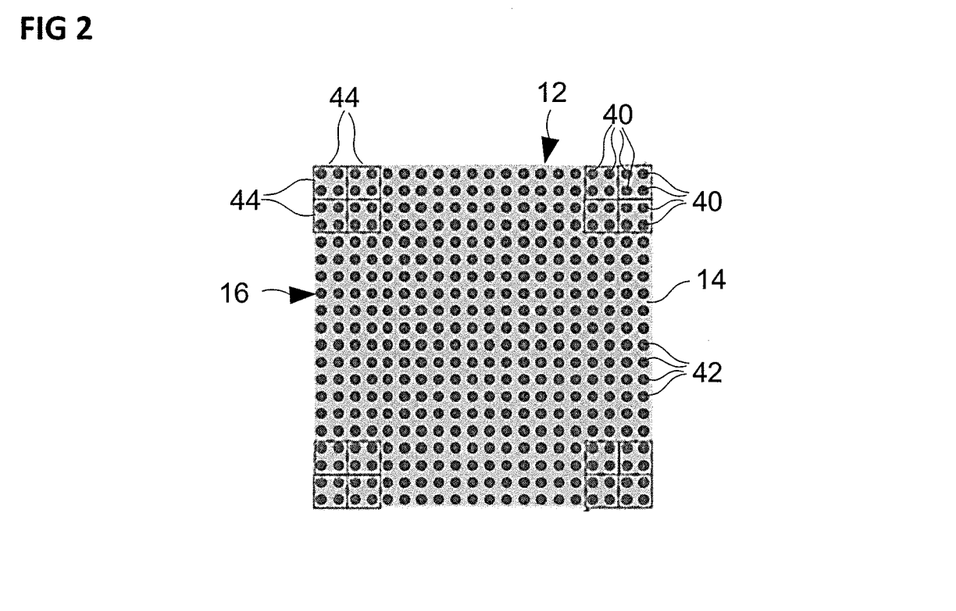
FIG. 2 shows a top view of an embodiment of a chip for a chip package.

FIG. 2 shows a top view of an embodiment of a first chip of a chip package 10, for example the first chip 12 of the chip package 10 shown in FIG. 1. The first side of the first chip 12 may face the second chip 22. There may be arranged at least two different kinds of contacts 16 at the first side of the first chip 12, for example there may be arranged first contacts 40 and second contacts 42. The contacts 40, 42 may be distributed over the whole surface or only a part of the surface of the first side of the first chip 12. A distance from one of the contacts 40, 42 to the next contact 40, 42 may be in the range from about 1 μm to about 100 μm, for example in the range from about 5 μm to about 80 μm, for example in the range from about 20 μm to about 75 μm. The distance between two neighbored contacts 40, 42 may also be referred to as a pitch of the contacts 40, 42. The pitch between the first contacts 40 and the pitch between the second contacts 42 may be the same or may differ from each other. The pitches may be regular or not. Further, the form and size of the first contacts 40 and the second contacts 42 may be the same form and/or the same size or may be different from each other.

The first contacts 40 may be arranged for carrying out and/or triggering the test circuit of the first chip 12. The first contacts 40 may be configured to provide a test mode of the integrated circuit of the first chip 12. In the test mode, the self-test of the integrated circuit may be carried out. The first contacts 40 may have no further function than contacting the test circuit and/or carrying out the self-test. For example, some of the first contacts 40 are only arranged for inputting some test signals into the test circuit triggering the self-test and others of the first contacts 40 are only arranged for reading out output signals being representative for the results of the corresponding self-test. The testing may be carried out before manufacturing the chip package 10, for example before arranging the first chip 12 on the second chip 22.

The first contacts 40 may be arranged at the outside of the surface of the first side of the first chip 12. For example, if the first side is formed polygonal, for example rectangular, for example as a square, the first contacts 40 may be arranged in the corners of the corresponding polygonal surface. Alternatively or additionally, the first contacts 40 may be arranged at the outermost rows and/or columns of the contacts 16 on the first side of the first chip 12. The first contacts 40 may be arranged in several groups. Each group of first contacts 40 may include four first contacts 40. The first contacts 40 of one of the groups 44 may be arranged in corners of polygonal surfaces, for example rectangles, for example squares. Every corner of the first side of the first chip 12 may include several groups 44 of first contacts 40. The groups 44 of first contacts 40 may be arranged such that all groups 44 of one of the corners form a rectangular surface or a square.

The first contacts 40 which are arranged at and/or in the corners of the first side of the first chip 12 may have the risk to suffer from their outermost position in such that they are located at high level of thermo-mechanical stress in the chip package 10 and/or that they may be damaged during the testing of the first chip 12 and/or the manufacturing of the chip package 10. However, at this stage of the design/manufacturing method of the chip package 10 the resistivity of the contacts 40 in the package is no longer functional relevant, because the first chip 12 may already be tested via the first contacts 40 and damaged first chip 12 may be further used for the chip package 10 without any disadvantage.

For testing the integrated circuit all groups 44 of contacts 40, 42 may be electrically contacted or only some of these groups. The first chip 12 may include further or less groups 44 of contacts 40, 42. Alternatively or additionally, the first contacts 40 of the groups 44 may be arranged according to another pattern than squares, for example according to rectangles, triangles or circles. Additionally or alternatively, one or more of the groups 44 may include less or more first contacts 40.

Figure 3:
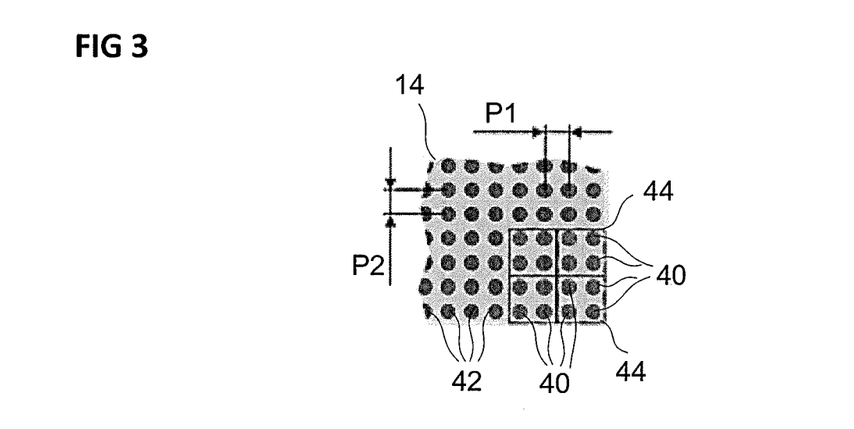
FIG. 3 shows a detailed top view of the chip of FIG. 2.

FIG. 3 shows a detailed view of the first side of the first chip 12 shown in FIG. 2. The contacts 40, 42 may have a first pitch P1 and a second pitch P2 from one each other. The contacts 40, 42 may be arranged rectangular as shown in FIG. 3. The first pitch P1 may extend in a horizontal direction and the second pitch P2 may extend in a vertical direction. So, the first pitch P1 may extend in a direction rectangular to the second pitch P2. The first pitch P1 may be the same than the second pitch P2 or the first pitch P1 may be another pitch as the second pitch P2.

Figure 4:
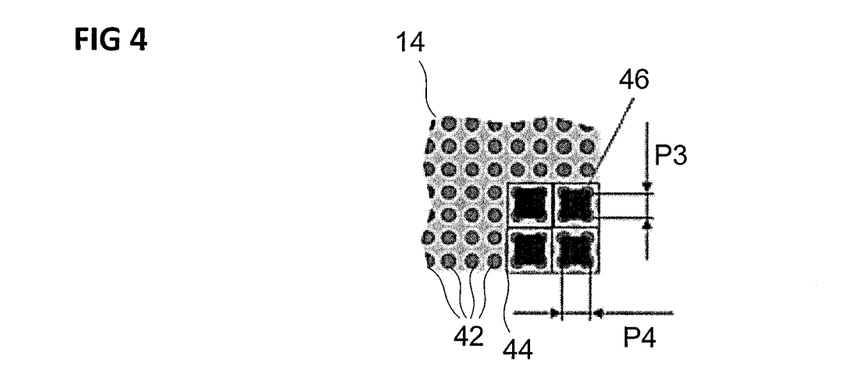
FIG. 4 shows a detailed top view of the chip of FIG. 3 and test pins of a testing device.

FIG. 4 shows a detailed top view of the first chip 12 shown in FIG. 3, wherein some test pins 46 are arranged on the first contacts 40 at one corner of the first side of the first chip 12. At least one of the test pins 46 may cover a bigger area than one of the first contacts 40. In various embodiments, the test pins 46 may have such a diameter that they at least partially overlap all first contacts 40 of one of the groups 44. In other words, each test pin 46 may cover four of the first contacts 40 of one of the groups 44. The test pins 46 may have a first width P3 and/or a second width P4.

Figure 5:
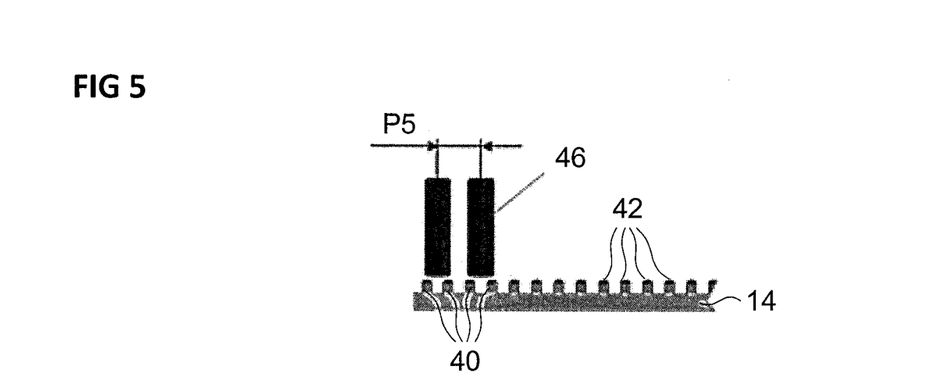
FIG. 5 shows a detailed side view of the chip and the test pins of FIG. 4.

FIG. 5 shows a side view of the first chip 12 and the test pins 46 shown in FIG. 4. The test pins 46 may be in direct contact with the first contacts 40. The test pins 46 may be coupled with a test device (not shown), for example a probe card. The test device may be configured to start the test mode and/or to carry out and/or trigger the self-test by the test circuit of the integrated circuit. In order to provide sufficient performance to send and receive data from the integrated circuit in order to carry out the self-test the first contacts 40 are electrically connected with first driver stages (not shown) of the test circuit of chip 12. For example all first contacts 40 of one of the groups 44 are contacted to one first driver stage. The first driver stages may provide sufficient performance, for example a first driver performance, in order to carry out the self-test and sending back the result(s) to the test device. The first driver performance may be characterized by at least one of a high driver strength, a high output current, a high fanout, a low driver speed, and a high ESD protection. In contrast, the second contacts 42 are not coupled with the first driver stages and are instead coupled with corresponding second driver stages or second drivers (not shown) providing less performance, for example a second driver performance, than the first driver stages. The second driver performance may be characterized by at least one of a low driver strength, a low output current, a low fanout, a high driver speed, and a low/no ESD protection. For example, for the second contacts 42 no high output current may be necessary, because they may be provided for being directly coupled to the third contacts 26 of the second chip 22 shown in FIG. 1. The test pins 46 may have a third pitch P5 from one each other. The third pitch P5 may be twice as large as the first and/or the second width P3, P4.

Figure 6:
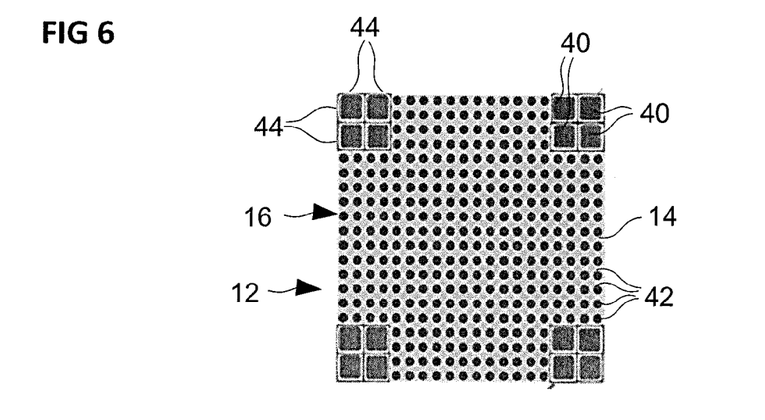
FIG. 6 shows a top view of an embodiment of a chip for a chip package.

FIG. 6 shows a top view of an exemplary embodiment of a first chip 12 which may widely correspond to the first chip 12 as explained above. The first chip 12 may include first contacts 40 which have a different size and/or geometrical form than the second contacts 42. For example, the first contacts 40 are larger in diameter than the second contacts 42. Additionally or alternatively, the first contacts 40 may include a polygonal shape, for example a rectangular shape in contrast to the second contacts 42 which may include a circular shape. The first contacts 40 may be arranged in the corners of the surface of the first side of the first chip 12. For example, in each corner there may be arranged four first contacts 40. Thus, each group 44 may only include (exactly) one first contact 40. The pitch between the first contacts 40 may be the same or may be different than the pitch between the second contacts 42.

Figure 7:
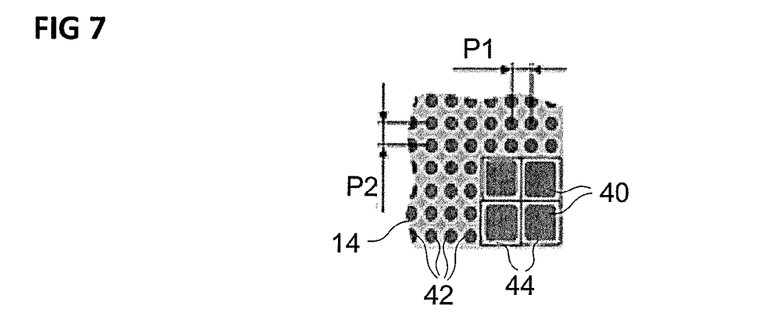
FIG. 7 shows a detailed top view of the chip of FIG. 6.

FIG. 7 shows a detailed top view of the first chip 12 of FIG. 6.

Figure 8:
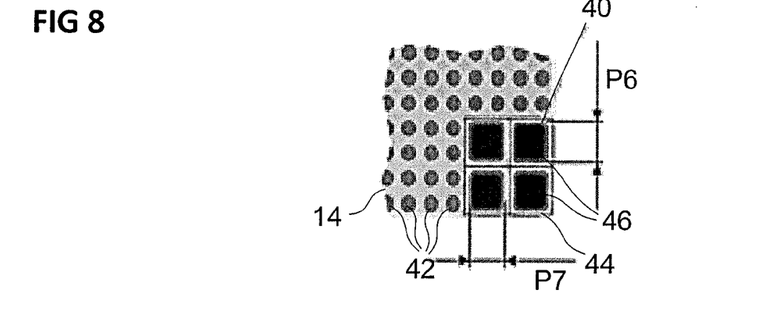
FIG. 8 shows a detailed top view of the chip of FIG. 7 and test pins of a testing device.

FIG. 8 shows a detailed top view of the first chip 12 of FIG. 7 and test pins 46 which are arranged such that each test pin 46 contacts one of the first contacts 40. The first contacts 40 may have a third width P6 and/or a fourth width P7. The third width P6 and/or the fourth width P7 may be the same or may be different from each other. The first width P3 and/or the second width P4 may be the same as or may be different from the third width P6 and/or the fourth width P7.

Figure 9:
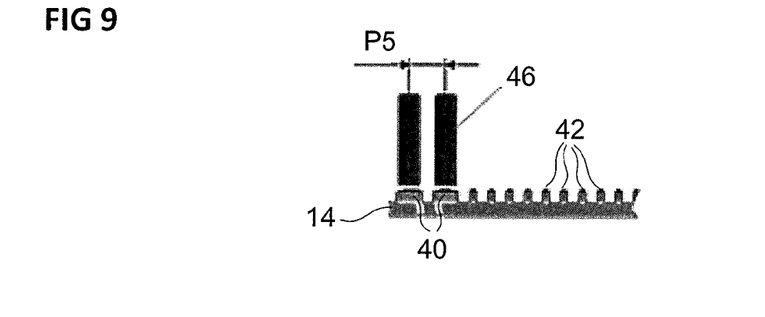
FIG. 9 shows a detailed side view of the chip and the test pins of FIG. 8.

FIG. 9 shows a detailed side view of the first chip 12 and the test pins 46 of FIG. 8. The test pins 46 may be in direct contact with and so mechanically and electrically coupled to the first contacts 40. The test pins 46 may be connected to a test device, for example a probe card (not shown).

The test device, e.g. the probe card, enables to send an input signal to the test pins 46 and further to the first contacts 40 in order to activate the test mode of the test circuit and/or to carry out the self-test of the integrated circuit of the first chip 12. In other words the test device or probe card enables to trigger the built-in self-test of the first chip 12 via the test pins 46 and the first contacts 40. For example, the first contacts 40 may have no further functionality than testing/receiving test results the first chip 12. Therefore, the first contacts 40 may be without use after testing the first chip 12 and an alleged damage (e.g. imprints of the test pin) to the first contacts 40 would be without effect on the normal operation in the operation mode of the first chip 12. If the first chip 12 is connected to the second chip 22 and/or arranged in the chip package 10 the first contacts 40 may be connected to a given potential, for example a fixed potential, for example to ground, or the first contacts 40 may be without any electrical connection. Further, the first contacts 40 may only include contact pads, for example flat contact pads, on the first side of the first chip 12 without extending away from the surface of the first side in contrast to the second contacts 42.

Figure 10:
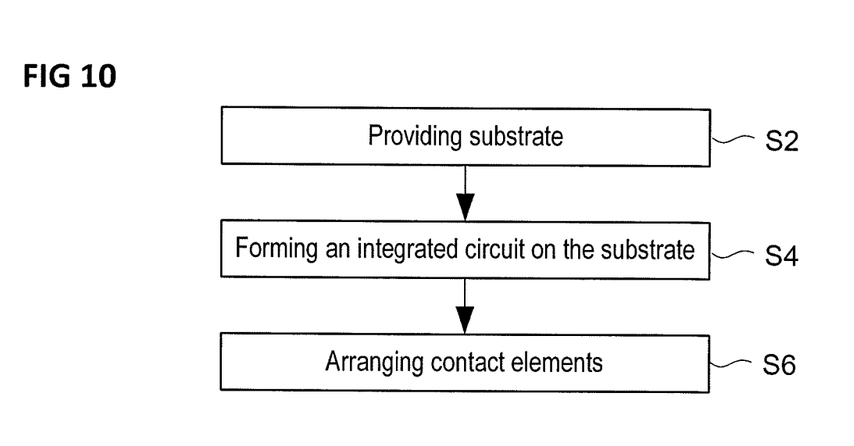
FIG. 10 shows a flow chart of an embodiment of a method for manufacturing a chip.

FIG. 10 shows a flow chart of an embodiment of a method for manufacturing a chip, for example the first chip 12 explained above.

In S2 a substrate may be provided. The substrate may include or be made of semiconductor material and the substrate may include one, two or more layers on top of the substrate.

In S4 an integrated circuit is formed on the substrate. The integrated circuit may be formed by one or more photolithographic and etching processes and/or by other layer forming processes like for example by printing. The integrated circuit may include a test circuit and an operation circuit. The test circuit may be configured to provide a test mode for testing the integrated circuit. The test circuit may be formed in such a way that a self-test, e.g. a built-in self-test may be carried out with the test circuit. The operation circuit may configured to provide an operation mode being different from the test mode and may for example be referred to as a normal mode of the integrated circuit. The operation circuit may be formed such that at least one operation different from the self-test may be carried out with the operation circuit. The test circuit and the operation circuit may include the same electronic elements and/or different electronic elements of the integrated circuit. For example some of the components of the integrated circuit belong to the test circuit and to the operation circuit and some of the components of the integrated circuit belong only to the test circuit and some of the components of the integrated circuit belong only to the operation circuit.

The integrated circuit may be a microcontroller or microprocessor. The integrated circuit may include several transistors, resistors, and/or capacitors. The integrated circuit may for example include several drivers and/or driver stages which may be connected to the contacts 40, 42. The first drivers for the first contacts 40 have a different performance than the second drivers for the second contacts 42, because the second contacts 42 and the corresponding second drivers are only arranged for an internal communication in the chip package 10, e.g. between the first and the second chips 12, 22, and the first contacts 40 are arranged for an external communication, e.g. for receiving and sending test signals from and to the test device.

In S6, the contacts 16, e.g. the first contacts 40 and the second contacts 42 are arranged on the first side of the first chip.

Figure 11:
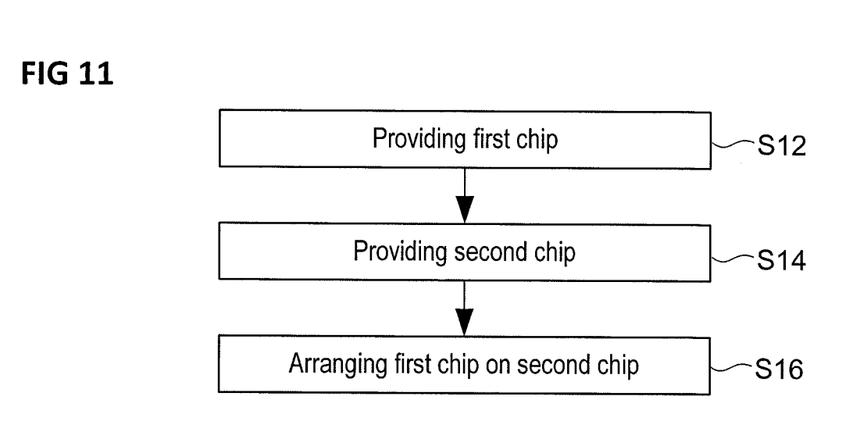
FIG. 11 shows a flow chart of an embodiment of a method for manufacturing a chip package.

FIG. 11 shows a flow chart of an embodiment of a method for manufacturing a chip package 10.

In S12, a first chip may be provided, for example the first chip 12 explained above. The first chip 12 may be provided by manufacturing the first chip 12, for example with the help of the above method for manufacturing the first chip 12. The first chip 12 may be tested as described above and only "known good" chips may be arranged into the chip package 10.

In S14, a second chip may be provided, for example the second chip 22 as explained above. The second chip 22 may be provided by firstly manufacturing the second chip 22, for example such that the second chip 22 may include one of a memory element, for example a flash memory, a sigma-delta converter, an AD-converter, a DA-converter, a delta-sigma converter, an input/output stage, a DC/DC converter. Further, the second chip 22 may be manufactured such that it includes third contacts 26 and fourth contacts 28. The third contacts 26 may be configured to electrically contact the first chip 12. The fourth contacts 28 may be configured to provide electrical contacts of the second chip 22 from outside, for example from another device of the chip package 10 or from outside of the chip package 10. In various embodiments, the second chip 22 may be connected to a carrier 32 of the chip package 10. The fourth contacts 28 may be designed for wire bonding and/or flip chip bonding. The fourth contacts 28 may be connected to TSVs (Through Silicon Vias).

In S16, the first chip 12 may be arranged on the second chip 22. In this context, the second chip 22 may be a mother-chip and the first chip 12 may be a daughter-chip. The first chip 12 may be arranged on the second chip 22 in such a way that the first contacts 40 of the first chip 12 have no electrical connection to the second chip 22 or such that the first contacts 40 are connected to a fixed potential like for example to ground. The second contacts 42 of the first chip 12 may be mechanically and/or electrically connected with the third contacts 26, for example by soldering, welding or gluing.

Figure 12:
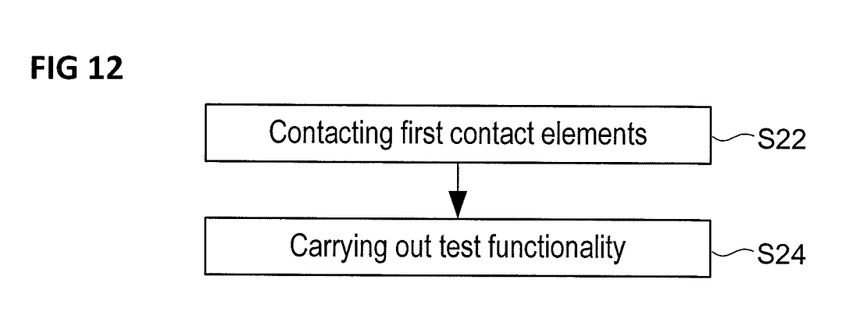
FIG. 12 shows a flow chart of an embodiment of a method for testing a chip.

FIG. 12 shows a flow chart of an embodiment of a method for testing the first chip 12. The method for testing the first chip 12 may be carried out between S12 and S14 of the method for manufacturing the chip package 10 or after S6 of the method for manufacturing the first chip 12.

In S22, the first contacts 40 may be electrically contacted, for example with the help of the test pins 46 of the test device or probe card. For example, one of the test pins 46 is directly and electrically coupled to two, three, four or more first contacts 40.

In S24, the self-test is carried out by the test circuit via the test pins 46 and the first contacts 40. During this process, one, two, or more test signals may be applied to the first chip 12 via the first contacts 40, e.g. one single test signal is simultaneously applied via one of the test pins 46 to all of the first contacts 40 which are in direct contact with the corresponding test pin 46. Thus, more than one of the first contacts 40 may receive the same test signal and therefore, in advance, these first contacts 40 may be directly and/or electrically coupled with each other. For example, those first contacts 40 may be electrically coupled to the same first driver stage. The input signal may trigger the self-test of the first chip 12 and/or activates the test mode of the first chip 12 via the first contacts 40. Others of the first contacts 40 are electrically coupled to further test pins 46 in order to receive the output signal of the test circuit and/or the self-test and so in order to receive the result of the self-test. Thus, the first contacts 40 are arranged for receiving test signals and for sending corresponding output signals to the test device.

The test device may be configured such that it may sense the input signals and receive the output signals of the integrated circuit and such that it is able to output whether the tested first chip 12 works properly or not.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip for a chip package, the chip comprising:
   a substrate,
   an integrated circuit over the substrate, the integrated circuit comprising a test circuit and an operation circuit, the test circuit comprising one or more first driver stages each having a first driver performance and the operation circuit comprising one or more second driver stages each having a second driver performance which is different to the first driver performance,
   first contacts electrically coupled with the one or more first driver stages, and
   second contacts electrically coupled with the one or more second driver stages,
   wherein the test circuit and the first contacts are configured to provide a test mode for testing the integrated circuit and wherein the operation circuit and the second contacts are configured to provide an operating mode of the integrated circuit being different from the test mode;
   wherein the first contacts are arranged in a plurality of groups, wherein all first contacts of one group are electrically coupled with each other by a pin that at least partially overlaps all first contacts in the group with the same first driver stage.

2. The chip of claim 1,
   wherein the first and second contacts are distributed over a polygonal surface of the chip and wherein the first contacts are arranged in at least one corner of the polygonal surface.

3. The chip of claim 1,
   wherein the first driver performance is at least five times larger than the second driver performance.

4. The chip of claim 3,
   wherein the ESD protection of the first contacts is at least five times larger than the ESD protection of the second contacts.

5. The chip of claim 1,
   wherein the first driver performance is at least five times smaller than the second driver performance.

6. The chip of claim 1,
   wherein a distance from one of the first contacts or one of the second contacts to an adjacent contact is in a range from about 1 µm to about 100 µm.

7. The chip of claim 1,
   wherein the first contacts have a first distance to each other and the second contacts have a second distance to each other, wherein the first distance is different from the second distance.

8. The chip of claim 1,
   wherein four first contacts are arranged in one group and wherein the four first contacts are arranged in corners of a square.

9. The chip of claim 1,
   wherein four groups of first contacts are arranged in one corner of a surface of the chip.

10. The chip of claim 1,
    wherein the performance of the one or more first driver stages or the one or more second driver stages is characterized by at least one of a driver strength, a driver speed, an ESD protection, an output current, and a fanout of the corresponding driver stages.

11. The chip of claim 1,
    wherein the first driver performance is characterized by at least one of a high driver strength, a low driver speed, a high ESD protection, a high output current, and a high fanout of the one or more first driver stages.

12. The chip of claim 1,
    wherein the second driver performance is characterized by at least one of a low driver strength, a high driver speed, a low ESD protection, no ESD protection, a low output current, and a low fanout of the one or more second driver stages.

13. A chip package, comprising:
a first chip comprising
- a substrate, an integrated circuit over the substrate, the integrated circuit comprising a test circuit and an operation circuit, the test circuit comprising one or more first driver stages each having a first driver performance and the operation circuit comprising one or more second driver stages each having a second driver performance which is different from the first driver performance,
- first contacts electrically coupled with the one or more first driver stages, and
- second contacts electrically coupled with the one or more second driver stages,
- wherein the test circuit and the first contacts are configured to provide a test mode for testing the integrated circuit and wherein the operation circuit and the second contacts are dedicated to providing an operating mode being different from the test mode, and a second chip carrying the first chip and comprising third contacts and fourth contacts, wherein the third contacts are electrically and mechanically coupled with corresponding second contacts of the first chip and wherein the fourth contacts are configured to provide electrical contacts of the chip package.

14. The chip package of claim 13,
wherein the first contacts of the first chip are not electrically coupled with the second chip and/or wherein the first contacts of the first chip are electrically coupled to a given potential.

15. The chip package of claim 13,
wherein the first chip comprises a microprocessor and the second chip comprises at least one of a memory, an AD-converter, a DA-converter, a delta-sigma converter, an input/output stage, and a DC/DC converter.

16. The chip package of claim 13,
wherein the first chip comprises a front side and a back side of the first chip,
wherein the first contacts of the first chip are arranged on the front side of the first chip,
wherein the second chip comprises a front side and a backside of the second chip,
wherein the third contacts of the second chip are arranged on the front side of the second chip, and
wherein the front side of the first chip faces the front side of the second chip.

17. A die for a chip package, comprising:
a substrate,
an integrated circuit over the substrate, the integrated circuit comprising a built in self-test circuit and an operation circuit, with the built in self-test circuit comprising first drivers having a first output current and with the operation circuit comprising second drivers having a second output current which is lower than the first output current,
contact pins which are electrically coupled with corresponding first drivers and which are provided for electrically contacting the built in self-test circuit, wherein the built in self-test circuit and the contact pins are configured to carry out a self-test of the integrated circuit and
second contacts which are electrically coupled with corresponding second driver stages, wherein the second contacts and the operation circuit are configured to carry out at least one operation of the integrated circuit being different from the self-test;
wherein the contact pins are arranged in a plurality of groups, wherein all contact pins of one group are electrically coupled with each other by a pillar that at least partially overlaps all contact pins in the group with the same first driver stage.

18. The die of claim 17,
wherein the contact pins and the second contacts are distributed over a polygonal surface of the die and wherein the contact pins are arranged at the corners of the polygonal surface.

19. The die of claim 17,
wherein the first output current is at least five times larger than the second output current.

20. The die of claim 17,
wherein a mean pitch between the contact pins, between the second contacts or between the contact pins and second contacts, is in a range of 1 μm to 100 μm.

21. The die of claim 17,
wherein the contact pins have a first mean pitch to each other and the second contacts have a second mean pitch to each other, wherein the first mean pitch is unequal to the second mean pitch.

22. The die of claim 17,
wherein four contact pins are arranged in one group and wherein these four contact pins are arranged in corners of a square with each corner comprising one contact pin.

23. The die of claim 17,
wherein four groups of contact pins are arranged in one corner of a surface of the chip.

* * * * *